United States Patent [19]
Choi et al.

[11] Patent Number: 5,949,727
[45] Date of Patent: Sep. 7, 1999

[54] SEMICONDUCTOR MEMORY DEVICE WITH DATA SENSING SCHEME REGARDLESS OF BIT LINE COUPLING

[75] Inventors: Byeng-Sun Choi, Kyunggi-do; Young-ho Lim, Kunggi-do, both of Rep. of Korea

[73] Assignee: Samsung Electronics, Co. Ltd., Suwon, Rep. of Korea

[21] Appl. No.: 09/006,290

[22] Filed: Jan. 13, 1998

[30] Foreign Application Priority Data

Jan. 13, 1997 [KR] Rep. of Korea ............................ 97-672

[51] Int. Cl.⁶ ...................................................... G11C 7/00
[52] U.S. Cl. ................ 365/203; 365/189.01; 365/189.09
[58] Field of Search ..................................... 365/203, 185, 365/230.06, 189.05, 189.01, 189.03, 189.09

[56] References Cited

U.S. PATENT DOCUMENTS

| | | | |
|---|---|---|---|
| 5,446,690 | 8/1995 | Tanaka et al. ............................ | 365/185 |
| 5,825,714 | 10/1998 | Kohno .................................. | 365/230.06 |

*Primary Examiner*—David Nelms
*Assistant Examiner*—David Lam
*Attorney, Agent, or Firm*—Marger Johnson & McCollom, P.C.

[57] ABSTRACT

A semiconductor memory device includes a precharge circuit for precharging bit lines responsive to a first control signal during a bit line precharge period and a plurality of transistors each having a current path connected between the corresponding bit line and the precharge circuit. The memory device also includes a control terminal for receiving a second control signal, a data sensing circuit for sensing data states on the bit lines during a data sensing period, and a control circuit for generating the first and second control signals. The second control signal has a first and a second voltage levels during the bit line precharge period and the data sensing period, respectively. The first voltage level is different from the second voltage level. As a result, the corresponding sensing node between the transistors and the data sensing means is maintained to a preset voltage without transitorily dropping during a data sensing period. The second control signal changes to the second voltage level during the bit line precharge period. By doing so, the bit line voltage does not momentarily drop owing to inter-bit line capacitive coupling and the corresponding sensing node maintains its preset voltage level during the data sensing period.

23 Claims, 5 Drawing Sheets

SEMICONDUCTOR MEMORY DEVICE WITH DATA SENSING SCHEME REGARDLESS OF BIT LINE COUPLING

FIELD OF THE INVENTION

The present invention relates to a semiconductor memory device and, more particularly to a read only memory (ROM) device capable of reading out serial data.

BACKGROUND OF THE INVENTION

As memory device density increases, inter-bit line space decreases. For high density integration, inter-bit line capacitance is higher than the bit line and fringe capacitance. Thus, capacitive bit line-to-bit line coupling is of serious concern.

FIG. 1 shows a burst mask ROM capable of reading out serial data. Referring to FIG. 1, the ROM device includes an array of memory cells 12 (the individual memory cells are not shown) disposed in a matrix of rows and columns and a plurality of bit lines BLi, where i=1 to 64. The bit lines BLi are selected by the 16-bit column selection signals YA0 to YA7 and YB0 to YB7. The memory cell array 12 is divided into 8 memory cell blocks 12-1 to 12-8, each having 8 bit lines. The ROM device, as is well known, can be a NAND-type or a NOR type depending upon the layout of memory cells. Generally, a NAND-type ROM has a smaller-sized memory cell array than a NOR-type ROM. The memory device shown in FIG. 1 further includes a bit line discharge circuit 14, a bit line charge circuit 16, a precharge level detecting circuit 18, a data sensing circuit 20, column selection circuits 22 and 24, and a data output circuit 26.

The memory device according to this embodiment typically includes a column predecoder circuit (not shown) and a data read out control circuit (not shown) disposed in close proximity to the memory cell array 12. The column decoder circuit and data read out control circuit are well known and are not described in further detail.

In addition to the memory cell array 12, each of the following associated circuits is divided into 8 blocks which correspond to the memory cell blocks 12-1 to 12-8, respectively: the bit line discharge circuit 14 (14-1 to 14-8), the bit line charge circuit 16 (16-1 to 16-8), the precharge level detecting circuit 18 (18-1 to 18-8), the data sensing circuit 20 (20-1 to 20-8), and the column selection circuit 22 (22-1 to 22-8). For instance, bit line discharge block 14-1, bit line charge block 16-1, precharge level detecting block 18-1, data sensing block 20-1, and column selection block 22-1 are formed in close proximity to memory cell block 12-1. Each of the bit line discharge circuit blocks 14-1 to 14-8 and each of the precharge level detecting circuit blocks 18-1 to 18-8 is formed by 8 NMOS transistors. Each of the bit line charge circuit blocks 16-1 to 16-8, data sensing circuit blocks 20-1 to 20-8, and column selecting circuit blocks 22-1 to 22-8 is formed by 8 PMOS transistors.

A discharge control signal Pdis is applied to the gates of the NMOS transistors included in the bit line discharge circuit 14. A precharge control signal Pbpre is also provided to the gates of the PMOS transistors included in the bit line charge circuit 16. The gates of the NMOS transistors included in the precharge level detecting circuit 18 are supplied with a precharge level control signal Vbias.

For each column selection block 22-1 to 22-8, the column selection signals YA0 to YA7 are applied to the gates of the PMOS transistors included therein. The gates of the 8 PMOS transistors included in the column selection circuit 24 are controlled by the column selection signals YB0 to YB7. The transistors of the column selection circuit 24 corresponds to the column selection blocks 22-1 to 22-8, respectively. The drains of the PMOS transistors included in the column selection circuit 24 are commonly connected to a data line DL. The data output circuit 26 comprises an NMOS transistor 27 and a NAND gate 28. The gate of the NMOS transistor 27 is provided with a control signal Siref from a read out control circuit (not shown) and its source-drain channel is connected between the data line DL and the ground voltage Vss. The read out control circuit is well known and will not be discussed in further detail. The NAND gate 28 has a first input for receiving the data signal on the data line DL, a second input for receiving a control signal SAfc from the read out control circuit (not shown), and an output for outputting a valid data signal PLj, where j=0 to 7.

FIG. 2A is an exemplary circuit for generating the precharge control voltage Pbpre shown in FIG. 1. Referring to FIG. 2A, the precharge control voltage generation circuit includes PMOS transistors 30, 34, and 36, inverters 32, 42, and 48, a NAND gate 44, and NMOS transistors 40, 50, and 52.

A control signal PRE from the data read out control circuit is applied to the gate of the PMOS transistor 30. Inverters 32 and 42 receive control signals STB and PRE, respectively, from the data read out control circuit. The control signal Vref generated by the data read out control circuit is applied to the gate of the NMOS transistor 40. The gate of the NMOS transistor 52 is supplied with the control signal PRE.

FIG. 2B is an exemplary circuit for generating the precharge level control voltage Vbias shown in FIG. 1. Referring to FIG. 2B, the precharge level control voltage generation circuit includes an inverter 54, a differential amplifier section 56, a pull-up transistor 64, a voltage divider section 66, and a pull-down transistor 68.

The differential amplifier section 56 has a first input terminal 58 for receiving the control signal Vref generated by the data read out control circuit, a second input terminal 60 coupled to the voltage divider section 56, and an output terminal 62 coupled to the gate of the pull-up transistor 64. The gates of transistors 76 and 80 are commonly supplied with the control signal Vref. The gate of transistor 78 is coupled to the voltage divider section 67. The control signal STB is provided to gates of transistors 68 and 82 via the inverter 54.

The voltage divider section 66 includes two serially connected resistors 84 and 86 for providing the control signal Vbias with different voltage levels responsive to the control signal Vref. The junction of the resistors 84 and 86 is connected to the input 60 of the differential amplifier section 56.

FIG. 3 is a timing diagram for the read operation of the semiconductor memory device shown in FIG. 1. The data read operation of the conventional ROM device will be described with reference to FIG. 3 and FIGS. 1, 2A, and 2B.

During the stand-by period T1, the control signal Pdis is set to the power supply voltage Vcc (e.g., 3.3 volts or 5 volts) such that all of the bit lines BLi are discharged and set to a ground voltage Vss by the discharge circuit 14. Also, the control signals STB and Vref are set to the power supply voltage Vcc while the control signal PRE is set to ground voltage Vss. Thus, the PMOS transistors 30, 34, 36, shown in FIG. 2A, are activated and the NMOS transistors 50 and 52, also shown in FIG. 2A, are deactivated resulting in the precharge control signal Pbpre changing to a power supply voltage Vcc. In the precharge level control voltage generating circuit shown in FIG. 2B, the precharge level control voltage Vbias changes to the power supply voltage Vcc by the action of the pull-up transistor 64 because NMOS transistors 82 and 68 are deactivated. Therefore, the voltage levels of nodes N1 to N64 between the bit line charge circuit 16 and the data sensing circuit 20 are equal to those of the bit lines BL1 to BL64.

During the bit line precharge period T2, control signal STB and discharge control signal Pdis are pulled down to ground voltage Vss, control signal PRE changes to power supply voltage Vcc, and control signal Vref changes to a predetermined voltage level $V_{REF1}$ (e.g., 1.2 volts). Thus, the discharge circuit 14 shuts off preventing the bit lines BLi from further discharging. During the precharge period T2, the precharge control signal Pbpre changes to a ground voltage Vss and precharge level control voltage Vbias changes to a predetermined voltage level $V_{REF2}$ (e.g., 2 volts). By doing so, the PMOS transistors included in the bit line charge circuit 16 are turned on so that source currents flow to the bit lines BLi from the power supply voltage Vcc.

During the bit line precharge period T2, the differential amplifier section 56 is activated since the control signal STB is pulled down to ground voltage Vss. The output voltage of the amplifier section 56 depends on the input voltage applied its input terminal 60 because the control signal Vref applied to the input terminal 58 of the differential amplifier section 56 is constant and equal to $V_{REF1}$. Thus, the voltage level $V_{REF2}$ of the precharge level control signal Vbias is determined by the ratio of the on-resistance of the PMOS transistor 64 and the total resistance of the voltage divider section 66.

As described above, the precharge control signal Pbpre and the precharge level control voltage Vbias are pulled down to ground voltage Vss and reference voltage $V_{REF2}$, respectively. The nodes N1 to N64 between the bit line charge circuit 16 and the data sensing circuit 20 are developed to power supply voltage Vcc. However, if the bit lines BL1 to BL64 reach the reference voltage $V_{REF2}$-Vtn, where Vtn is the threshold voltage of each NMOS transistor in the precharge level detecting circuit 18 the transistors included in the circuit 18 are turned off so that the charging operation of the bit lines stops. Consequently, all the bit lines are precharged to $V_{REF2}$-Vtn. Also, during the period T2, the control signal Siref changes to predetermined voltage level $V_{REF3}$ which allows the data line DL to become higher than the trip voltage of the NAND gate 28 when at least one of the nodes Ni (i=1 to 64) changes to ground voltage Vss, that is, when logic high data is transferred to the data line DL via column selection circuits 22 and 24. The NAND gate 28 outputs valid data PLj, where j=0 to 7, only when the control signal SAfc is at a logic high level (e.g., at power supply voltage Vcc).

During the data sensing period T3, the control signal PRE changes to ground voltage Vss again while the control signal STB and the reference voltage Vref remain in the same state as in the bit line precharge period T2. Therefore, transistors 30, 36, 40, 50, and 52 shown in FIG. 2A are activated such that the precharge control signal Pbpre is pulled up to reference voltage $V_{REF4}$ from ground voltage Vss. The reference voltage $V_{REF4}$ makes about half of the on-cell current flow to each bit line from the charge circuit 16. During the data sensing period T3, where the selected memory cells are on-cells, i.e., cells having a current sink path, the corresponding bit lines BLi change to a voltage lower than $V_{REF2}$-Vtn. The corresponding nodes Ni are developed to the same levels as the corresponding bit lines. Where the selected memory cells are off-cells, i.e., cells having no current sink path, the bit lines and the nodes are maintained to the power supply voltage Vcc.

During the data output period T4, the control signal SAfc changes to power supply voltage Vcc and the sensed parallel data is serially provided by means of the column selection circuits 22 and 24 and the data output circuit 26.

In the data read scheme described above, a first and a second adjacent bit lines are connected to an on-cell and an off-cell, respectively. The off-cell bit line level falls for a short period of time because of the bit line-to-bit line coupling when the on-cell bit line is pulled down to ground voltage Vss as shown in FIG. 3. The slight downward change in the voltage level of the off-cell bit line causes the corresponding transistor of the bit line level detecting circuit 18 to turn on. The corresponding sensing node level also falls for a short time along with the off-cell bit line level until the on-cell bit line settles into a stable state. This capacitive coupling results in sensing time delays, sensing failures, and the like.

SUMMARY OF THE INVENTION

It is an object of the present invention to provide a semiconductor memory device that overcomes the problems associated with prior art semiconductor memory devices. It is another object of the present invention to provide a semiconductor memory device having improved data read speed.

In order to achieve the above objects, there is provided a semiconductor memory device including an array of memory cells disposed in a matrix of rows and columns, a plurality of bit lines corresponding to the columns, a bit line precharge circuit for precharging the bit lines responsive to a first control signal, a plurality of transistors each having a current path connected between the corresponding bit line and the bit line precharge circuit and a control terminal for receiving a second control signal, a data sensing circuit for sensing data states on the bit lines via the transistors, and a control circuit for generating the first and second control signals. The second control signal has a first voltage level during a bit line precharge and a second voltage level during a data sensing period. The first voltage level is different from the second voltage level.

BRIEF DESCRIPTION OF THE DRAWINGS

The above objects and advantages of the present invention will become more readily apparent by describing in detail a preferred embodiment thereof with reference to the attached drawings in which.

DESCRIPTION OF THE PREFERRED EMBODIMENT

A preferred embodiment of the present invention will be described with reference to FIGS. 1, 2A, 4, and 5. It should be understood that the description of this embodiment is merely illustrative and does not limit the scope of the present invention.

Figure 1:
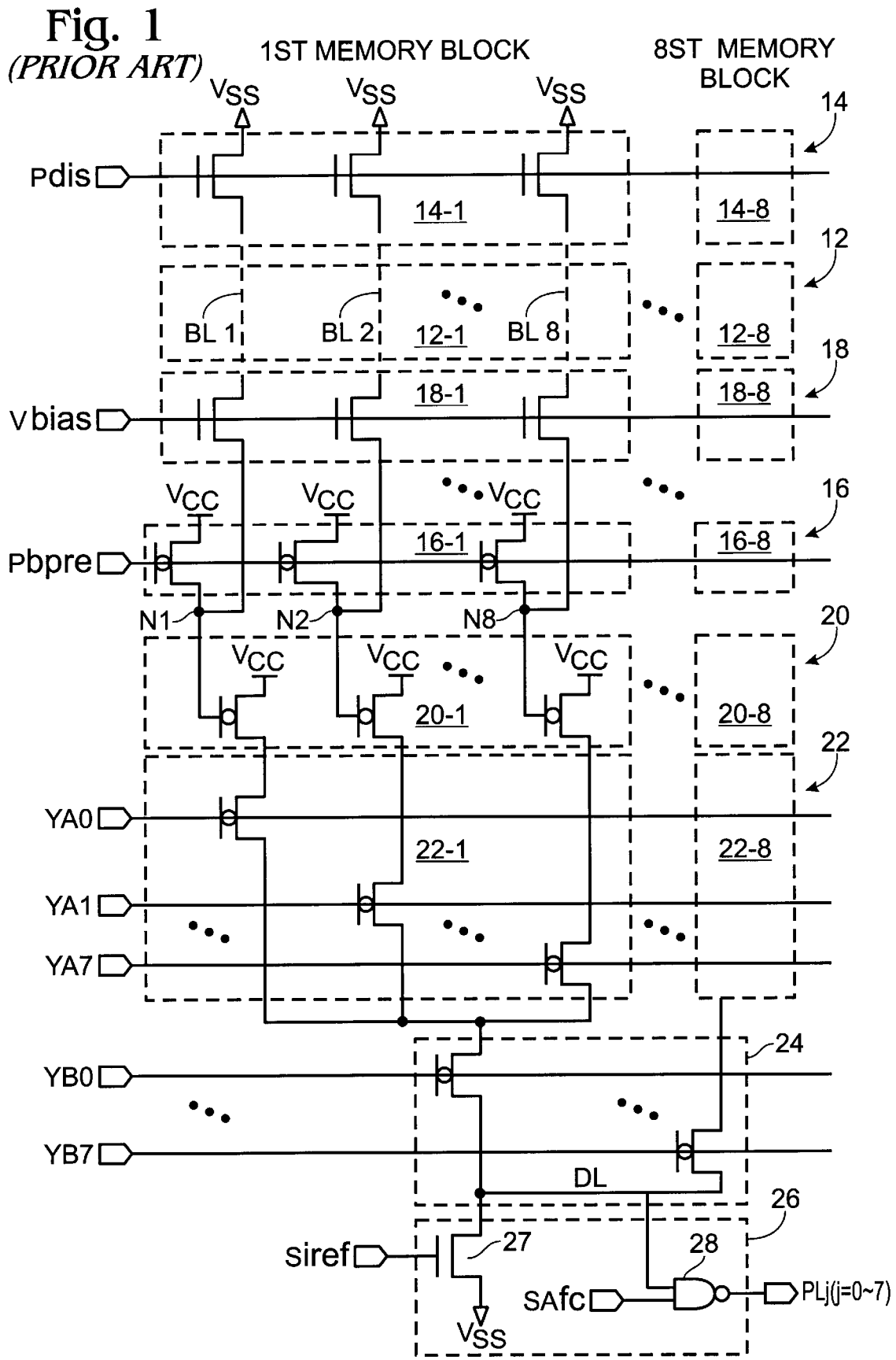
FIG. 1 is a circuit diagram of a semiconductor memory device.

A preferred embodiment of the present invention can be implemented in the semiconductor memory device shown in FIG. 1. The semiconductor memory device shown in FIG. 1 is a burst mash ROM. Referring to FIG. 1, the memory device shown includes an array 12 of memory cells (not shown) disposed in a matrix of rows and columns, each of the memory cells is programmable to store binary data having complementary logic states. The memory device also includes a plurality of bit lines BLi, where i=1 to 64. The memory cell array 12 is divided into 8 memory cell blocks 12-1 to 12-8, each of which has 8 bit lines. Although not shown in FIG. 1, the memory cell array 12 may be either a NAND structure cell array or an NOR structure cell array. The memory device further includes a bit line discharge circuit 14 for discharging the bit lines BLi during the stand-by period of its data read operation, a bit line charge circuit 16 for charging the bit lines BLi during the bit line precharge operation, and a precharge level detecting circuit 18 for detecting voltages on the bit lines during the bit line precharge operation and inhibiting each bit line from being overcharged when voltage on each bit line reaches a predetermined precharge voltage. Furthermore, the memory device includes a data sensing circuit 20 for sensing data stored in the memory cell array 12 during the data sensing period of the data read operation, first and second column selection circuits 22 and 24, respectively, which serve as a parallel-to-serial (P/S) converter for converting parallel data from the data sensing circuit 20 into serial data, and a data output circuit 26 for outputting the serial data from the first and second column selection circuits 22 and 24, respectively.

Although not shown in the figure, the memory device according to this embodiment further includes a column predecoder circuit and a data read out control circuit, which are well known and located in close proximity to the memory cell array 12. For purposes of explanation, assume that the memory device has an architecture where the bit lines BLi are selected by 16-bit column selection signals YA0 to YA7 and YB0 to YB7.

Each of the memory cell array 12 associated circuits, i.e., the bit line discharge circuit 14, the bit line charge circuit 16, the precharge level detecting circuit 18, the data sensing circuit 20, and the column selection circuit 22 is divided into 8 blocks (14-1 to 14-8, 16-1 to 16-8, 18-1 to 18-8, 20-1 to 20-8, and 22-1 to 22-8) which correspond to the memory cell array blocks 12-1 to 12-8, respectively, as shown in FIG. 1. For instance, bit line discharge block 14-1, bit line charge block 16-1, precharge level detecting block 18-1, data sensing block 20-1, and column selection block 22-1 are located in close proximity to memory cell block 12-1. Each of the associated blocks 14-1 to 14-8 and 18-1 to 18-8 is formed by 8 NMOS transistors. Similarly, each of the other associated blocks 16-1 to 16-8, 20-1 to 20-8, and 22-1 to 22-8 is formed by 8 PMOS transistors.

A discharge control signal Pdis is applied to the gates of the NMOS transistors included in the bit line discharge circuit 14. Each of the source/drain channels (or current paths) of the NMOS transistors included in the bit line discharge circuit 14 is connected between the corresponding bit line and ground voltage Vss. A precharge control signal Pbpre is also provided to the gates of the PMOS transistors included in the bit line charge circuit 16. Each of the source-drain channels of the PMOS transistors included in the bit line charge circuit is connected between the gate of the corresponding transistor included in the data sensing circuit 20 and power supply voltage Vcc. Furthermore, the gates of the NMOS transistors included in the precharge level detecting circuit 18 are supplied with a precharge level control signal Vbias. Each of the source-drain channels of the NMOS transistors included in the precharge level detecting circuit 18 is connected between the corresponding bit line and the gate of the corresponding transistor included in the data sensing circuit 20.

For each column selection block 22-1 to 22-8, the column selection signals YA0 to YA7 are respectively applied to the gates of the PMOS transistors included therein of which the source-drain channels are connected to the PMOS transistors included in the data sensing circuit 20. The second column selection circuit 24 includes 8 PMOS transistors. The gates of each of the 8 PMOS transistors included in the second column selection circuit 24 are provided with the column selection signals YB0 to YB7, respectively. The 8 PMOS transistors of the second column selection circuit 24 correspond to the column selection blocks 22-1 to 22-8, respectively. In other words, the source of each PMOS transistor included in the column selection circuit 24 is commonly connected with the source of the transistors included in the corresponding column selection block 22-1 to 22-8. The drains of the PMOS transistors included in the column selection circuit 24 are commonly connected to a data line DL. The data output circuit 26 comprises an NMOS transistor 27 and a NAND gate 28. The gate of the transistor 27 is provided with a control signal Siref. Control signal Siref is generated by a well-known read out control circuit not shown or discussed in further detail. The source-drain channel of transistor 27 is connected between the data line DL and the ground voltage Vss. The NAND gate 28 has a first input for receiving the data signal on the data line DL and a second input for receiving a control signal SAfc and an output for outputting valid data signal PLj, where j=0 to 7. The control signal SAfc is generated by a well-known read out control circuit and not explained in further detail.

Figure 2A:
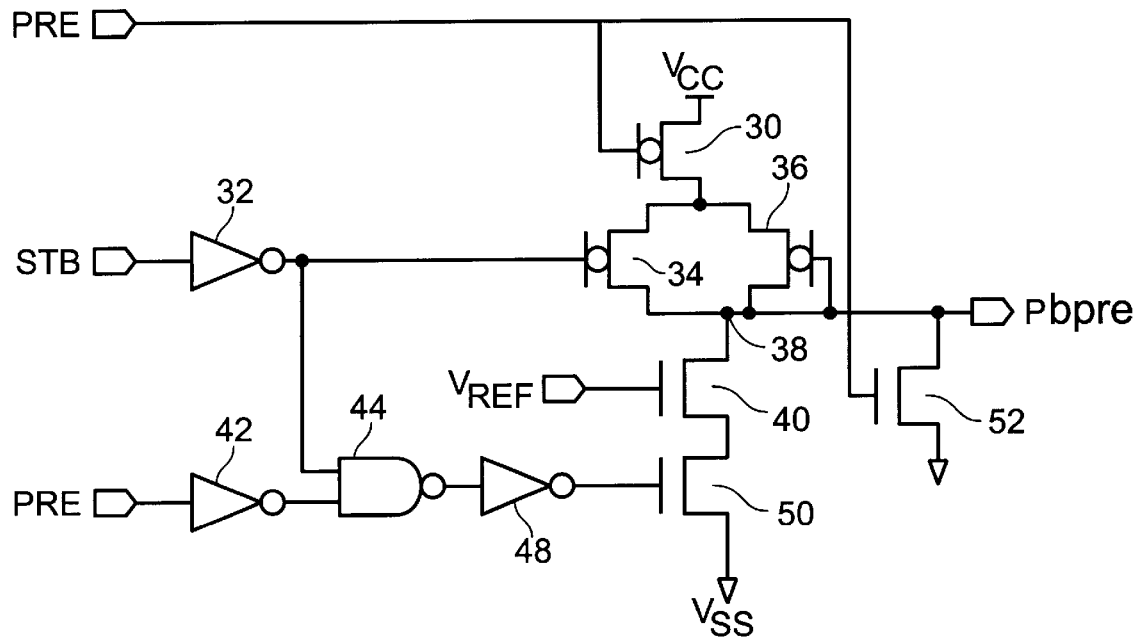
FIG. 2A is a circuit diagram of a precharge control signal Pbpre generating circuit.

FIG. 2A shows a precharge control signal Pbpre generating circuit for generating the precharge control signal Pbpre shown in FIG. 1. Referring to FIG. 2A, the precharge control signal Pbpre generating circuit includes PMOS transistors 30, 34, and 36, inverters 32, 42, and 48, NAND gate 44, and NMOS transistors 40, 50, and 52.

The control signal PRE generated by the data read out control circuit (not shown) is applied to the gate of the PMOS transistor 30. The source of PMOS transistor 30 is connected to power supply voltage Vcc. Input terminals of the inverters 32 and 42 receive control signals STB and PRE, respectively, generated by the data read out control circuit (not shown). The source-drain channels of the PMOS transistors 34 and 36 are connected in parallel between the drain of the PMOS transistor 30 and an output node 38 for providing the precharge control voltage signal Pbpre to the bit line charge circuit 16. The gates of the PMOS transistors 34 and 36 are coupled to the output terminal of the inverter 32 and the node 38, respectively. The NAND gate 44 has two input terminals for receiving the outputs of the inverters 32 and 42. The source-drain channels of the NMOS transistor 40 and 50 are serially connected between the output node 38 and the ground voltage Vss. A control signal Vref generated by the data read out control circuit (not shown) is applied to the gate of the NMOS transistor 40. The output of the NAND gate 44 is provided to the gate of the NMOS transistor 50 via the inverter 48. The source-drain channel of the NMOS transistor 52 is connected between the output node 38 and ground voltage Vss. The gate of the transistor 52 is supplied with the control signal PRE.

The semiconductor memory device of this invention includes a novel and non-obvious circuit for generating the precharge level control voltage Vbias shown in FIG. 1 which can prevent data read delays owing to capacitive coupling between adjacent bit lines.

Figure 2B:
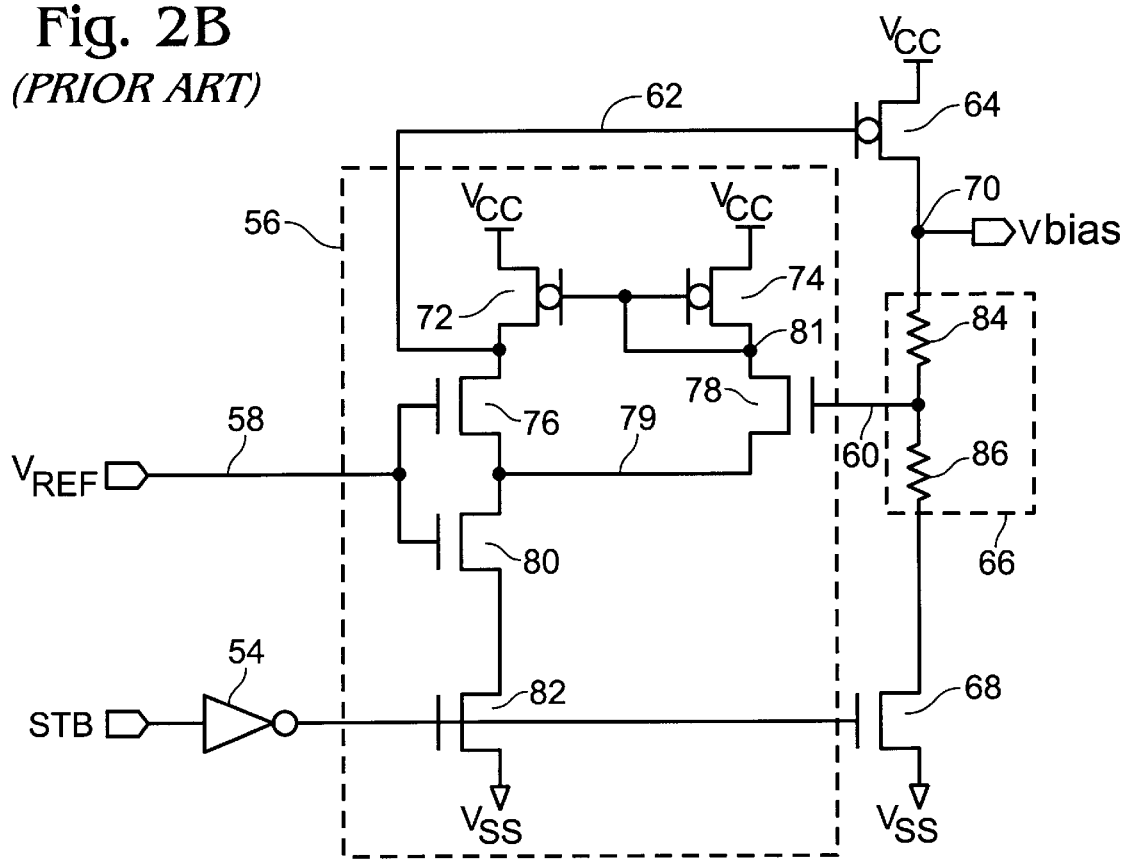
FIG. 2B is a circuit diagram of a precharge level control voltage Vbias generating circuit.
Figure 4:
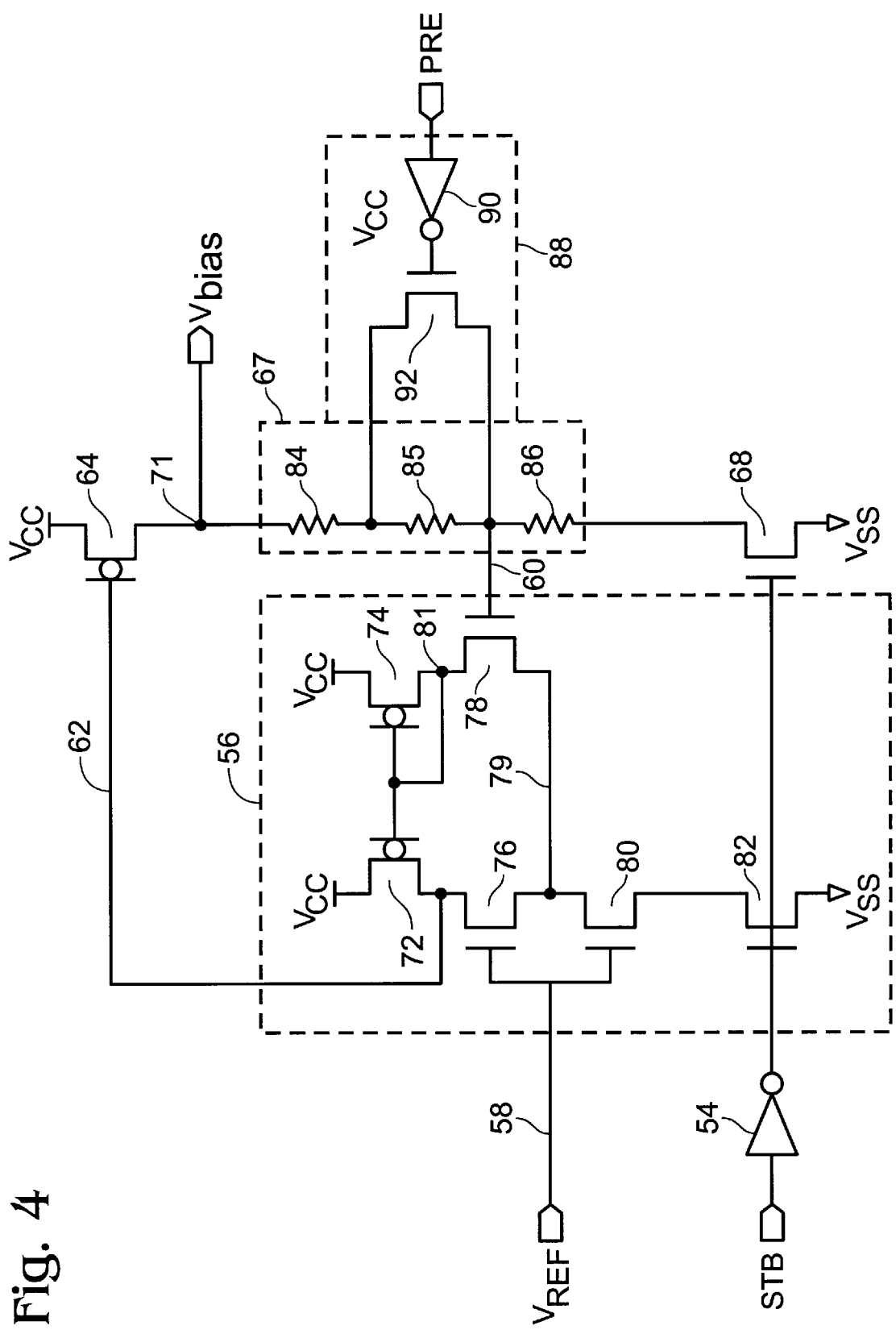
FIG. 4 is a circuit diagram of the precharge level control voltage Vbias generating circuit in accordance with a preferred embodiment of the present invention.

FIG. 4 shows a precharge level control voltage Vbias generating circuit according to a preferred embodiment of the present invention. In FIG. 4 and FIG. 2B, identical components are indicated by the same reference numerals. Referring to FIG. 4, the precharge level control voltage Vbias generating circuit includes an inverter 54, a differential amplifier section 56, a PMOS pull-up transistor 64, a voltage divider section 67, an NMOS pull-down transistor 68, and a voltage control section 88.

The differential amplifier section 56 has a first input terminal 58 for receiving the control signal Vref generated by a well-known data read out control circuit (not shown), a second input terminal 60 coupled to the voltage divider section 67, and an output terminal 62 coupled to the gate of the pull-up transistor 64. The differential amplifier section 56 includes a current mirror (or current sources) formed by PMOS transistors 72 and 74, a differential pair formed by NMOS transistors 76 and 78, a cascode circuit formed by NMOS transistor 80, and a current sink formed by an NMOS transistor 82. The source-drain channels of the transistors 72, 76, 80, and 82 are serially connected between the power supply voltage Vcc and ground voltage Vss. The drains of the transistors 72 and 76 are commonly connected with the gate of the pull-up transistor 64. The source-drain channel of the pull-up transistor 64 is connected with node 71 for providing the precharge level control signal Vbias to the precharge level detecting circuit 18 shown in FIG. 1. The gates of the transistors 76 and 80 are commonly supplied with the control signal Vref. The source-drain channels of transistors 74 and 78 are serially connected between the power supply voltage Vcc and the junction node 79 of the transistors 76 and 80. The gates of the transistors 72 and 74 are commonly connected to the junction node 81 of the transistors 74 and 78. The gate of transistor 78 is connected to the voltage divider section 67. The control signal STB generated by the data read out control circuit (not shown) is provided to the gates of transistors 68 and 82 via inverter 54.

The voltage divider section 67 includes serially connected resistors 84, 85, and 86. Resistor 84 is connected at one end to node 71. The junction of resistors 85 and 86 is connected to the input terminal 60 of the differential amplifier section 56.

The voltage control section 88 includes an inverter 90 and an NMOS transistor 92. The source-drain channel of NMOS transistor 92 is connected across the resistor 85. The control signal PRE generated by the data read out control circuit (not shown) is applied to the gate of the transistor 92 via the inverter 90. As a matter of course, the voltage control section 88 may be made up of only one PMOS transistor. The voltage control section 88 varies the voltage level of the signal Vbias by varying the resistance value between the node 71 and the input terminal 60 of the differential amplifier section 56 responsive to the signal PRE.

Figure 5:
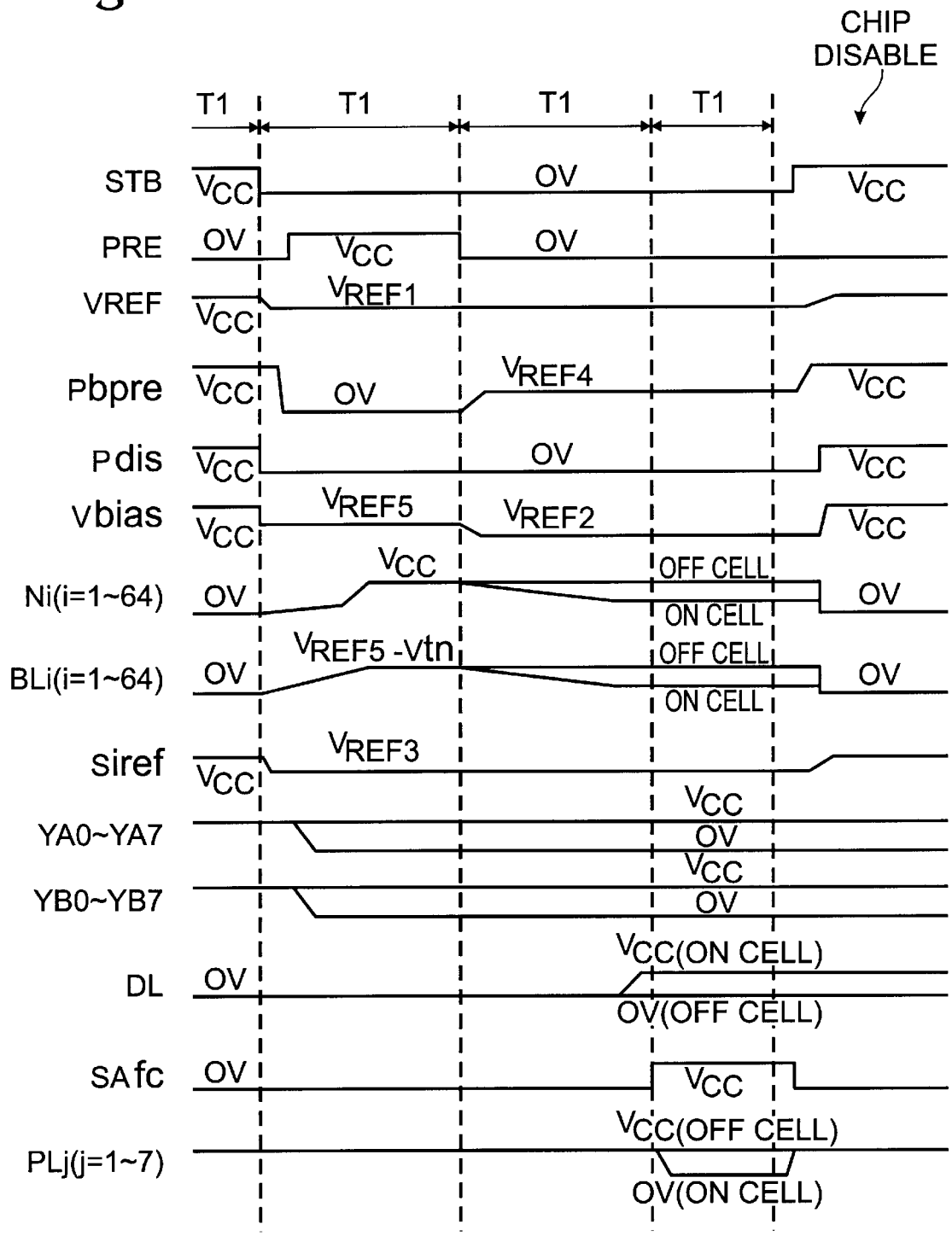
FIG. 5 is a timing diagram of the read operation of the semiconductor memory device including the circuits of FIGS. 1, 2A, and 4.

FIG. 5 is a timing diagram for the data read out operation of the semiconductor memory device having the circuits shown in FIGS. 1, 2A, and 4. Referring to FIG. 5, data read operation is divided into four periods: a stand-by period T1, a bit line precharge period T2, a data sensing period T3, and a data output period T4. During the bit line precharge period T2, all the bit lines BL1 to BL64 are charged with a precharge voltage in preparation to read out the data stored in the selected memory cells. During the data sensing period T3, the voltage levels on the bit lines associated with the selected memory cells are sensed by the data sensing circuit 20 to determine whether the selected memory cells are on-cells or off-cells. During the data output period T4, the sensed data is outputted to external circuitry (not shown).

During the stand-by period T1, discharge control signal Pdis is set to power supply voltage Vcc (e.g., 3.3 volts or 5 volts) so that the bit lines BLi, where i=1 to 64, are discharged and set to ground voltage Vss by the discharge circuit 14. Additionally, control signals STB and Vref are set to power supply voltage Vcc while control signal PRE is set to ground voltage Vss. In the precharge control signal Pbpre generating circuit of FIG. 2A, thus, the PMOS transistors 30, 34, and 36 are activated and the NMOS transistors 50 and 52 are deactivated so that control signal Pbpre changes to power supply voltage Vcc. In the precharge level control voltage Vbias generating circuit of FIG. 4, the NMOS transistors 82 and 68 are deactivated, the precharge level control voltage Vbias changes to power supply voltage Vcc by the action of pull-up transistor 64. By doing so, the control signals Pbpre and Vbias generated from the circuits of FIGS. 2A and 4, respectively, are at the power supply voltage Vcc thereby equalizing the voltage levels of all nodes N1 to N64 between the bit line charge circuit 16 and the data sensing circuit 20 to those of the bit lines BL1 to BL64. During this period, control signal Siref is at power supply voltage level Vcc and control signal SAfc is at ground voltage level Vss. The output signal PLj of the data output circuit 26 thus remains at power supply voltage Vcc but it is only provided during a data output period T4.

During the bit line precharge period T2, control signal STB and discharge control signal Pdis are pulled down to ground voltage Vss, control signals PRE and Vref change to power supply voltage Vcc and a predetermined voltage level $V_{REF1}$ (e.g., 1.2 volts), respectively. Thus, the discharge circuit 14 prevents the bit lines BLi from further discharging. During this period, the circuit shown in FIG. 2A generates a precharge control signal Pbpre having a ground voltage Vss and the circuit shown in FIG. 4 generates a precharge level control voltage Vbias having a predetermined voltage level $V_{REF5}$. The predetermined voltage level $V_{REF5}$ is greater than the voltage drop $V_{REF2}$ (e.g., about 2 volts) across the resistors 84 and 86 in the subsequent period T3 by the capacitive coupling voltage $V_{BCP}$ between adjacent bit lines. As a result, the PMOS transistors included in the bit line charge circuit 16 are turned on allowing source currents to flow to the bit lines BLi from the power supply voltage Vcc.

During the precharge period T2, the differential amplifier section 56 is activated since the control signal STB is pulled down to ground voltage Vss from power supply voltage Vcc. When this occurs, the voltage output from the differential amplifier 56 depends on the input voltage applied its input terminal 60 because the control voltage Vref applied to the input terminal 58 is constant and equal to predetermined voltage level $V_{REF1}$. In other words, the on-resistance of the pull-up transistor 64 varies with the divided voltage by the voltage divider section 67, i.e., the voltage drop across the resistor 86. The transistor 92 is turned on or off responsive to the control signal PRE so that total resistance of the voltage divider section varies. Therefore, the voltage level of the precharge level control voltage Vbias is determined by the ratio of the on-resistance of the transistor 64 and the total resistance of the voltage divider section 67.

As described previously, during the precharge period T2, the precharge control signal Pbpre and the precharge level control voltage Vbias are pulled down to ground voltage Vss and predetermined voltage level $V_{REF5}$, respectively. Nodes N1 to N64 between the bit line charge circuit 16 and the data sensing circuit 20 are developed up to power supply voltage level Vcc. However, if the bit lines BL1 to BL64 reach $V_{REF5}$-Vtn (where Vtn represents the threshold voltage of each NMOS transistor included in the precharge level detecting circuit 18), the transistors included in the precharge level detecting circuit 18 are turned off so that the charging operation of the bit lines terminates. Consequently, the bit lines BL1 to BL64 are precharged to a voltage level equal to $V_{REF5}$-Vtn.

During one read cycle, only one of the column select signals YA0 to YA7 becomes active and column select signals YB0 to YB7 become sequentially active in a predetermined sequence such that the 8-bit data sensed by the data sensing circuit 20 is serially read out.

Also during the period T2, the control signal Siref retains the predetermined voltage level $V_{REF3}$ which allows the data line DL to become higher than the trip voltage of the NAND gate 28 when at least one of the nodes Ni, where i=1 to 64, changes to ground voltage Vss, that is, when logic high data is transferred to the data line DL via column selection circuits 22 and 24. The NAND gate 28 outputs valid data PLj, where j=0 to 7, only when the control signal SAfc is at a logic high level (e.g., at power supply voltage Vcc).

Next, during the data sensing period T3, the control signal PRE changes to ground voltage Vss again while the control signal STB and the control signal Vref remain in the same state as in the bit line precharge period T2. Therefore, transistors 30, 36, 40, 50, and 52 are active, which pulls up the precharge control signal Pbpre from ground voltage Vss to predetermined voltage level $V_{REF4}$. The predetermined voltage level $V_{REF4}$ provides about half of the on-cell current flow to each bit line from the charge circuit 16. The control signal PRE is at ground voltage Vss rendering the NMOS transistor 92 conductive so that the precharge level control voltage Vbias is pulled down to predetermined voltage level $V_{REF2}$ from predetermined voltage level $V_{REF5}$. During the period T3, the corresponding bit lines BLi for the selected memory cells (on-cells) become lower than $V_{REF5}$-Vtn and the corresponding nodes Ni are developed to the same voltage levels as the corresponding bit lines since their current sink paths are formed. On the other hand, the corresponding bit lines and nodes for the selected memory cell (off-cells) in case that the selected memory cells are maintained to the precharge voltage $V_{REF5}$-Vtn and power supply voltage Vcc, respectively. Therefore, when two adjacent bit lines are connected to on-cell and the other to an off-cell, even though the off-cell bit line level lowers by the bit line-to-bit line coupling voltage $V_{BCP}$ from $V_{REF5}$-Vtn, the corresponding transistor of the precharge level detecting circuit 18 is turned off since the precharge level control voltage Vbias is pulled down to predetermined voltage level $V_{REF2}$ from predetermined voltage level $V_{REF5}$. As a result, the corresponding node Ni is maintained to power supply voltage Vcc without momentarily dropping.

Finally, during the data output period T4, the control signal SAfc changes to power supply voltage Vcc and the sensed parallel data is serially provided to external circuitry by means of the column selection circuits 22 and 24 and the data output circuit 26.

During the bit line precharge period T2, the capacitive bit line-to-bit line coupling voltage is taken into consideration and the bit lines are precharged thus enhancing data sensing speed and sensing margin.

Having illustrated and described the principles of the invention in a preferred embodiment thereof, it should be readily apparent to those skilled in the art that the invention can be modified in arrangement and detail without departing from such principles.

We claim all modification coming within the spirit and scope of the following claims:

1. A semiconductor memory device having a data read operation including a bit line precharge period, a data sensing period and a data output period, the device comprising:

an array of memory cells disposed in a matrix of rows and columns, each memory cell being programmable to store binary data, the binary data having complementary logic states;

a plurality of bit lines corresponding to the columns, each bit line connected to at least one of the memory cells;

means for precharging the plurality of bit lines in response to a first control signal during the bit line precharge period;

a plurality of transistors each having a current path connected between a corresponding bit line and the means for precharging and a control terminal for receiving a second control signal;

means for sensing data states on the plurality of bit lines via the plurality of transistors; and means for generating the first and second control signals, the second control signal having a first non-zero predetermined voltage level during the bit line precharge period and a second non-zero predetermined voltage level during the data sensing period, the first predetermined voltage level being different than the second predetermined voltage level.

2. The semiconductor memory device of claim 1 wherein each of the plurality of transistors are NMOS transistors.

3. The semiconductor memory device of claim 1 wherein the first predetermined voltage level is higher than the second predetermined voltage level.

4. A semiconductor memory device having a data read operation including a bit line precharge period, a data sensing period and a data output period, the device comprising:

an array of memory cells disposed in a matrix of rows and columns, each memory cell being programmable to store binary data, the binary data having complementary logic states;

a plurality of bit lines corresponding to the columns, each bit line connected to at least one of the memory cells;

means for precharging the plurality of bit lines in response to a first control signal during the bit line precharge period;

a plurality of transistors each having a current path connected between a corresponding bit line and the means for precharging and a control terminal for receiving a second control signal;

means for sensing data states on the plurality of bit lines via the plurality of transistors; and means for generating the first and second control signals, the second control signal having a first predetermined voltage level during the bit line precharge period and a second predetermined voltage level during the data sensing period, the first predetermined voltage level being different than the second predetermined voltage level;

wherein the means for generating the first and second control signals includes a voltage control section for providing the first and second predetermined voltage levels to the second control signal.

5. The semiconductor memory device of claim 4 wherein the voltage control section includes three serially connected resistors.

6. The semiconductor memory device of claim 5 wherein the voltage control section includes an inverter for inverting a third external control signal and an NMOS transistor having a source-drain channel connected across one of the three serially connected resistors and a gate for receiving the inverted version of the third control signal.

7. The semiconductor memory device of claim 5 wherein the voltage control section includes a PMOS transistor having a source-drain channel connected across one of the three serially connected resistors and a gate for receiving a third control signal.

8. The semiconductor memory device of claim 4 wherein each of the plurality of transistors are NMOS transistors.

9. The semiconductor memory device of claim 4 wherein the first predetermined voltage level is higher than the second predetermined voltage level.

10. A semiconductor memory device, comprising:
an array of memory cells disposed in a matrix of rows and columns for storing binary data;
a plurality of bit lines corresponding to the columns, each bit line connected to at least one of said memory cells;
a precharge circuit coupled to the plurality of bit lines for precharging the bit lines to a precharge voltage level during a precharge period responsive to a first control signal;
a precharge level detecting circuit coupled to the precharge circuit for detecting the precharge voltage level responsive to a second control signal;
a data sensing circuit coupled to the plurality of bit lines for sensing the binary data stored in the array of memory cells during a data sensing period;
a control signal generating circuit for generating the first and second control signals, the second control signal having a first non-zero predetermined voltage level during the bit line precharge period and a second non-zero predetermined voltage level during the data sensing period.

11. The semiconductor memory device of claim 10 wherein the first predetermined voltage level is higher than the second predetermined voltage level.

12. A semiconductor memory device, comprising:
an array of memory cells disposed in a matrix of rows and columns for storing binary data;
a plurality of bit lines corresponding to the columns, each bit line connected to at least one of said memory cells;
a precharge circuit coupled to the plurality of bit lines for precharging the bit lines to a precharge voltage level during a precharge period responsive to a first control signal;
a precharge level detecting circuit coupled to the precharge circuit for detecting the precharge voltage level responsive to a second control signal;
a data sensing circuit coupled to the plurality of bit lines for sensing the binary data stored in the array of memory cells during a data sensing period; and
a control signal generating circuit for generating the first and second control signals, the second control signal having a first predetermined voltage level during the bit line precharge period and a second predetermined voltage level during the data sensing period;
wherein the first predetermined voltage level is higher than the second predetermined voltage level; and
wherein the control signal generating circuit includes a voltage divider circuit for providing the first and second predetermined voltage levels to the second control signal responsive to a control signal.

13. The semiconductor memory device of claim 12 wherein the voltage divider circuit includes three serially connected resistors.

14. The semiconductor memory device of claim 13 wherein the voltage divider circuit includes a PMOS transistor having a source-drain channel connected across a center one of the three serially resistors.

15. The semiconductor memory device of claim 13 wherein the voltage divider circuit includes an inverter and an NMOS transistor having a source-drain channel connected across a center one of the three serially resistors and a gate connected to the inverter.

16. A method of reading binary data stored in a semiconductor memory device, the semiconductor memory device having an array of memory cells arranged in a matrix of rows and columns and a plurality of bit lines corresponding to the columns, each bit line connected to at least one memory cells of the array of memory cells, the method comprising:
providing a first non-zero voltage level to a first control signal during a precharge period;
providing a second non-zero voltage level to the first control signal during a data sensing period;
precharging the plurality of bit lines in the precharge period responsive to the first control signal; and
sensing the stored data in the data sensing period responsive to a second control signal while the first control signal is at the second voltage level.

17. The method of claim 16 wherein providing the first voltage level to the first control signal includes providing a first voltage level higher than the second voltage level.

18. The method of claim 16 wherein providing the first and the second voltage levels to the first control signal includes providing a first and second voltage levels that are different.

19. The method of claim 16 wherein the semiconductor memory device includes a voltage divider circuit and wherein providing a second voltage level to the first control signal includes changing a resistance of a voltage divider circuit.

20. The method of claim 19 wherein the voltage divider circuit includes three serially connected resistors and a switch connected across a center one of the three serially connected resistors and wherein changing the resistance of the voltage divider circuit includes bypassing the center resistor of the three serially connected resistors by activating the switch.

21. The method of claim 20 wherein the switch is an NMOS or a PMOS transistor.

22. A method of reading binary data stored in a semiconductor memory device, the semiconductor memory device having an array of memory cells arranged in a matrix of rows and columns and a plurality of bit lines corresponding to the columns, each bit line connected to at least one memory cells of the array of memory cells, the method comprising:
generating a first control signal having a first and second voltage levels using a voltage divider circuit;
precharging the plurality of bit lines in the precharge period responsive to the first control signal; and sensing the stored data in the data sensing period responsive to a second control signal while the first control signal is at the second voltage level.

23. The method of claim 22 wherein generating a first control signal includes:

serially connecting a plurality of resistors; and
connecting a transistor across at least one of the plurality of resistors.

* * * * *

UNITED STATES PATENT AND TRADEMARK OFFICE
CERTIFICATE OF CORRECTION

PATENT NO.   : 5,949,727                                     Page 1 of 1
DATED        : September 7, 1999
INVENTOR(S)  : Choi et al.

It is certified that error appears in the above-identified patent and that said Letters Patent is hereby corrected as shown below:

Title page,
Item [54], in the Title, "SEMICONDUCTOR MEMORY DEVICE WITH DATA SENSING SCHEME REGARDLESS OF BIT LINE COUPLING" should read -- SEMICONDUCTOR MEMORY DEVICE WITH DATA SENSING SHEME REGARDLESS OF BIT LINE TO BIT LINE COUPLING --.

Signed and Sealed this

Seventh Day of May, 2002

*Attest:*

*Attesting Officer*

JAMES E. ROGAN
*Director of the United States Patent and Trademark Office*

UNITED STATES PATENT AND TRADEMARK OFFICE
CERTIFICATE OF CORRECTION

PATENT NO.    : 5,949,727
DATED         : September 7, 1999
INVENTOR(S)   : Choi et al.

Figure 3:
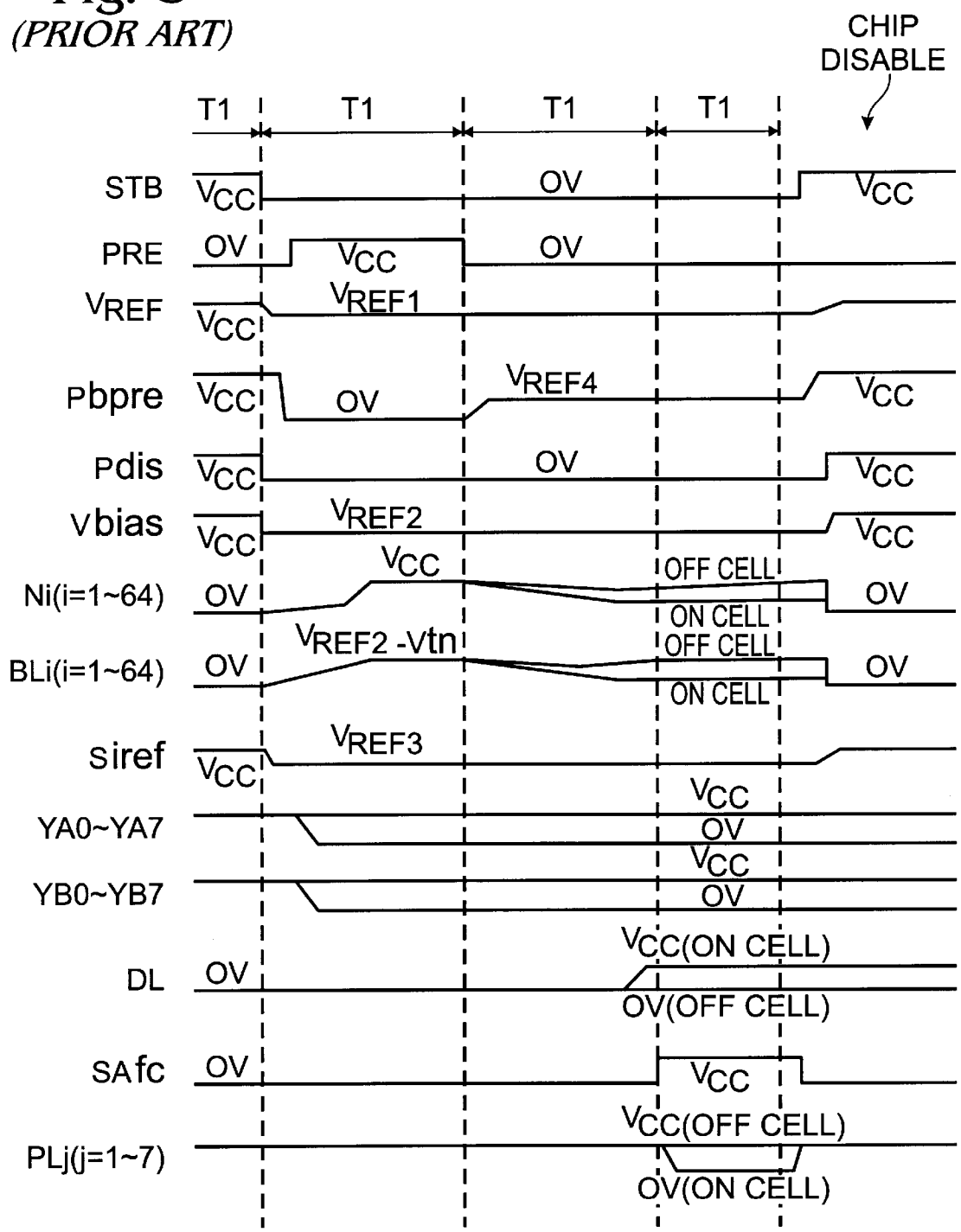
FIG. 3 is a timing diagram of the read operation of the semiconductor memory device including the circuits shown in FIGS. 1, 2A, and 2B.

It is certified that error appears in the above-identified patent and that said Letters Patent is hereby corrected as shown below:

Drawings
FIG. 3 (PRIOR ART), Sheet 3 of 5, first row, second column, "T1" should read -- T2 --.
FIG. 3 (PRIOR ART), Sheet 3 of 5, first row, third column, "T1" should read -- T3 --.
FIG. 3 (PRIOR ART), Sheet 3 of 5, first row, fourth column, "T1" should read -- T4 --.
FIG. 5, Sheet 5 of 5, first row, second column, "T1" should read -- T2 --.
FIG. 5  Sheet 5 of 5, first row, third column, "T1" should read -- T3 --.
FIG. 5, Sheet 5 of 5, first row, fourth column, "T1" should read -- T4 --.

Signed and Sealed this

Twenty-eighth Day of December, 2004

JON W. DUDAS
*Director of the United States Patent and Trademark Office*